(12) United States Patent
Suh et al.

(10) Patent No.: US 7,485,576 B2
(45) Date of Patent: Feb. 3, 2009

(54) METHOD OF FORMING CONDUCTIVE PATTERN, THIN FILM TRANSISTOR, AND METHOD OF MANUFACTURING THE SAME

(75) Inventors: Min-Chul Suh, Suwon-si (KR); Jae-Bon Koo, Suwon-si (KR); Taek Ahn, Suwon-si (KR); Hye-Dong Kim, Suwon-si (KR); Fischer Joerg, Berlin (DE); Werner Humbs, Berlin (DE)

(73) Assignees: Samsung SDI Co., Ltd., Suwon-si, Gyeonggi-do (KR); Samsung SDI Germany GmbH, Ostendstrasse, Berlin (DE)

( * ) Notice: Subject to any disclaimer, the term of this patent is extended or adjusted under 35 U.S.C. 154(b) by 0 days.

(21) Appl. No.: 11/296,874

(22) Filed: Dec. 8, 2005

(65) Prior Publication Data

US 2006/0145146 A1   Jul. 6, 2006

(30) Foreign Application Priority Data

Dec. 8, 2004   (KR) .............. 10-2004-0103129
Apr. 14, 2005  (KR) .............. 10-2005-0030943

(51) Int. Cl.
   *H01L 21/44* (2006.01)
(52) U.S. Cl. .............. 438/662; 438/68; 438/149; 427/64; 427/68; 427/532; 257/E21.592
(58) Field of Classification Search .............. 438/149, 438/68, 21, 662; 257/40, 64, 68, 532, 72, 257/E21.592; 427/64, 68, 532
See application file for complete search history.

(56) References Cited

U.S. PATENT DOCUMENTS

2003/0059987 A1* 3/2003 Sirringhaus et al. ......... 438/149

(Continued)

FOREIGN PATENT DOCUMENTS

DK           102 55 870         6/2004

(Continued)

OTHER PUBLICATIONS

European Office Action of the European Patent Application No. 05 11 1732, issued on Jun. 9, 2006.

(Continued)

*Primary Examiner*—George Fourson
*Assistant Examiner*—John M Parker
(74) *Attorney, Agent, or Firm*—Robert E. Bushnell, Esq.

(57) ABSTRACT

A method of forming a conductive pattern in which the conductive pattern can be easily formed at a low temperature without a photolithography process by forming the conductive pattern using a laser ablation method and an inkjet method, an organic thin film transistor manufactured using the method, and a method of manufacturing the organic thin film transistor. The method of forming a conductive pattern in a flat panel display device includes preparing a base member, forming a groove having the same shape as the conductive pattern in the base member, and forming the conductive pattern by applying a conductive material into the groove. The base member has one of a structure including a plastic substrate having the groove and a structure including a substrate and an insulating layer which is arranged on the substrate and which has the groove.

9 Claims, 15 Drawing Sheets

U.S. PATENT DOCUMENTS

| | | | |
|---|---|---|---|
| 2004/0178391 A1 | 9/2004 | Conaghan et al. | |
| 2004/0200061 A1* | 10/2004 | Coleman et al. | 29/825 |
| 2004/0224433 A1 | 11/2004 | Yamazaki et al. | |
| 2005/0214983 A1* | 9/2005 | Maekawa | 438/149 |
| 2005/0247978 A1* | 11/2005 | Weng et al. | 257/347 |
| 2006/0046359 A1* | 3/2006 | Noda et al. | 438/149 |
| 2006/0079032 A1* | 4/2006 | Denda | 438/149 |

FOREIGN PATENT DOCUMENTS

| | | |
|---|---|---|
| JP | 2001-118496 | 4/2001 |
| JP | 2001118496 A * | 4/2001 |
| JP | 2003-92410 | 3/2003 |
| KR | 2004-0028010 | 4/2004 |
| KR | 2004-0029402 | 4/2004 |
| KR | 10-2004-0065175 | 7/2004 |
| KR | 2004-0084427 | 10/2004 |
| WO | WO 03/080285 | 10/2003 |
| WO | WO 2004/004025 | 1/2004 |
| WO | WO 2004/055919 | 7/2004 |
| WO | WO 2004/055920 | 7/2004 |
| WO | WO 2005/022664 | 3/2005 |
| WO | WO 2006/062826 | 6/2006 |

OTHER PUBLICATIONS

An article "High-Resolution Inkjet Printing of All-Polymer Transistor Circuits" written by Sirringhaus, et al., published in Science, American Association for the Advancement of Science, vol. 290, pp. 2123-2126 on Dec. 15, 2000.

An article "Metallization of Solar Cells with Ink Jet Printing and Silver Metallo-Organic Inks" written by Teng, et al., published in IEEE Transactions on Components, Hybrids, and Manufacturing Technology, vol. 11, No. 3, pp. 291-297 on Sep. 1, 1988.

European Office Action of the European Patent Application No. 05 11 1732, issued on Apr. 12, 2006.

Korean Office Action of the Korean Patent Application No. 2004-103129, issued on Jul. 13, 2006.

"Nanotechnology", Wikipeida, the free encyclopedia, http://en.wikipedia.org/wiki/Nanotechnology.

Nanotechnology—Nanoscience glossary, Nanocompositech, http://www.nanocompositech.com/glossary-nanocomposite-nanotechnology.htm.

"Nanoparticles and Powders", http://www.ringsurf.com/online/2018-nanoparticles_and_powders.html.

"Risk Assessment of Nanoparticles", IOM, http://www.iom-world.org/research/nanoparticles.php.

"Nanotechnology solutions", Malvern.com, http://www.malvern.co.uk/LabEng/industry/nanotechnology/nanoparticle_definition.htm.

"What are Nanoparticles", An Introduction to Nanoprticles, http://www.chm.bris.ac.uk/webprojects2002/etan/Webpages/home2.htm.

Karn et al., "Nano particles Without Macroproblems", IEEE Spectrum Special Report, http://spectrum.ieee.org/Sep07/5487.

Chinese Office action dated Jul. 4, 2008 for corresponding Chinese patent application No. 200510138091.6. (with English translation).

*Office action* from the Japanese Patent Office issued in Applicant's corresponding Japanese Patent Application No. 2005-353685 dated Aug. 5, 2008.

* cited by examiner

METHOD OF FORMING CONDUCTIVE PATTERN, THIN FILM TRANSISTOR, AND METHOD OF MANUFACTURING THE SAME

CLAIM OF PRIORITY

This application makes reference to, incorporates the same herein, and claims all benefits accruing under 35 U.S.C. §119 from applications earlier filed in the Korean Intellectual Property Office on 8 Dec. 2004 and 14 Apr. 2005 and there duly assigned Serial Nos. 10-2004-0103129 and 10-2005-0030943, respectively.

BACKGROUND OF THE INVENTION

1. Field of the Invention

The present invention pertains to a flat panel display device, and more particularly to a method of forming a conductive pattern in an organic electroluminescent display device by using a laser ablation process and an inkjet process, an organic thin film transistor manufactured using the method, as well as a method of manufacturing the organic thin film transistor.

2. Description of the Related Art

Organic thin film transistors (OTFT) have been given much attention to as driving elements for next-generation display devices. The organic thin film transistors employ an organic layer as a semiconductor layer instead of a silicon layer. The organic thin film transistors are classified into low-molecular organic thin film transistors including oligothiophene, pentacene, or the like and high-molecular organic thin film transistors including polythiophene, depending upon materials of the organic layer.

In organic electroluminescent display devices employing such organic thin film transistors as switching elements, a plurality of pixels are arranged in a matrix on a substrate and each pixel includes two organic thin film transistors, such as a switching organic thin film transistor and a driving organic thin film transistor, a capacitor, and an organic electroluminescent element in which an organic layer is interposed between an upper electrode and a lower electrode.

Generally, a flexible organic electroluminescent display device uses a flexible substrate as a substrate, the flexible substrate generally being a plastic substrate. Since the plastic substrate has a very small degree of thermal stability, it is necessary to manufacture the flexible organic electroluminescent display device using low-temperature processes. Since the organic thin film transistors having an organic layer as a semiconductor layer can be manufactured using low-temperature processes, the organic thin film transistors have attracted much attention as switching elements for the flexible organic electroluminescent display devices.

A pentacene thin film transistor which can shorten the time for depositing a thin film and improve hole mobility is disclosed in Korean Laid Open Patent Publication No. 2004-0028010. An element structure of an organic thin film transistor which can improve electrical performance of the thin film transistor and a method of manufacturing the organic thin film transistor are disclosed in Korean Laid Open Patent Publication No. 2004-0084427. A thin film transistor in which a channel region is made of organic compound having radicals and which can improve the carrier mobility and the ratio of on current to off current is disclosed in Japanese Laid Open Patent Publication 2003-92410.

An organic thin film transistor includes a gate electrode formed on a substrate, a gate insulating layer formed on the substrate and on the gate electrode, source and drain electrodes formed on the gate insulating layer, and a semiconductor layer formed on the source and drain electrodes and on the gate insulating layer.

In the organic thin film transistor, since conductive patterns such as the gate electrode and the source and drain electrodes are formed using a photolithography process, there is a disadvantage in that the processes are complex and the processes must be performed at a low temperature due to the small degree of thermal stability of the substrate. On the other hand, an inkjet method is known as the method of forming a conductive pattern such as the source and drain electrodes and the gate electrode. A method of forming source and drain electrodes by applying an electroless gold plating solution on a substrate in an inkjet method, heating the solution at 90° C. to form a gold thin film pattern is disclosed in Korean Laid Open Patent Publication No. 2004-0029402. As described above, in the method of forming source and drain electrodes by using an inkjet method, the source and drain electrodes are formed by pattern-applying and then curing a solution including a material for the source and drain electrodes on the substrate.

Since the method of forming source and drain electrodes employs the inkjet method, there is an advantage in that the processes can be simplified and performed at a low temperature due to omission of a photolithography process. However, there is a problem in that pinning points are generated with evaporation of a solvent at the time of applying and then curing the material for the source and drain electrodes and that a coffee stain effect that occurs at edges of a pattern and becomes relatively thick results.

Such an effect increases as the evaporation speed of the solvent increases. In addition, when line patterns such as the source and drain electrodes and the gate electrode are printed as in the related art, the effect becomes more severe, thus forming a sectional profile having protrusions at the edges.

A thin film transistor having a bottom gate structure has a sectional structure that a gate insulating layer is formed on a gate electrode. Therefore, when the gate electrode is formed using the inkjet method, the thin film transistor has the sectional profile that damages the gate insulating layer formed thereon. Therefore, what is needed is a method of making a device and a device where low temperature processes only are used on a flexible substrate that overcomes the above problems.

SUMMARY OF THE INVENTION

It is therefore an object of the present invention to provide an improved method of making a conductive pattern.

It is also an object of the present invention to provide an improved method of manufacturing a thin film transistor.

It is yet an object of the present invention to provide an improved design for a conductive pattern and for a thin film transistor.

It is further an object of the present invention to provide an improved flat panel display device.

These and other objects can be achieved by a method of forming a conductive pattern in a flat panel display device, the method including preparing a base member, forming a groove having the a shape of the conductive pattern in the base member, and forming the conductive pattern by applying a conductive material into the groove. The base member can include a plastic substrate and an insulating layer formed on the substrate, and wherein the groove is formed in the insulating layer.

The base member can include a plastic film which is made of a material selected from the group consisting of polyether sulphone (PES), polyacrylate (PAR), polyether imide (PEI), polyethylene napthalate (PEN), polyethylene terepthalate (PET), polyphenylene sulfide (PPS), polyarylate, polyimide, polycarbonate (PC), cellulose triacetate (TAC), and cellulose acetate propinonate (CAP).

The insulating layer comprises at least one layer, and wherein each of said at least one layer being selected from the group consisting of an organic insulating film, an inorganic insulating film and an organic-inorganic hybrid film. The inorganic insulating film comprises a material selected from the group consisting of $SiO_2$, $SiN_x$, $Al_2O_3$, $Ta_2O_5$, barium strontium titanate (BST), and lead zirconate titanate (PZT), wherein the organic insulating film is selected from a group of consisting of polymethyl methacrylate (PMMA), polystyrene (PS), phenol polymer, acryl polymer, imide polymer such as polyimide, arylether polymer, amide polymer, fluoride polymer, p-xylene polymer, vinylalcohol polymer, and parylene.

The forming the groove in the base member includes irradiating a laser beam onto a portion of the base member where the conductive pattern is to be formed and etching the portion by using a laser ablation process. The forming the conductive pattern comprises ejecting and applying a solution comprising the conductive material via an inkjet method.

The conductive pattern includes one nanocomposite selected from the group consisting of Ag nanocomposite, Cu nanocomposite, Au nanocomposite, Pt nanocomposite, and carbon nanocomposite. The conductive pattern is produced by pattern-applying and then curing an ink comprising a conductive particle and an organic binder via an inkjet method. The conductive particle includes a particle selected from a group consisting of Ag nanoparticle, Pt nanoparticle, Au nanoparticle, Cu nanoparticle, carbon nanoparticle, and fine graphite particle.

The conductive material can include either a material selected from the group consisting of Au nanocomposite and Pt nanocomposite or a material obtained by pattern-applying and then baking an ink containing an organic binder and a nanoparticle of carbon nanoparticle and metal nanoparticle having a work function greater than (HOMO value of the organic semiconductor layer −0.5 eV), and the metal nanoparticle includes one of a Au nanoparticle and a Pt nanoparticle.

The flat panel display device includes a thin film transistor having a semiconductor layer, a gate electrode, and source and drain electrodes, a capacitor having a lower electrode and an upper electrode that overlaps with the lower electrode and which is connected one electrode of the source and drain electrodes of the thin film transistor, and an organic electroluminescent element having a lower electrode connected to the other electrode of the source and drain electrodes of the thin film transistor, an organic layer, and an upper electrode, wherein the conductive pattern is at least one of the gate electrode, the source and drain electrodes, and the upper and lower electrodes of the capacitor.

Of another aspect of the present invention, there is provided a thin film transistor that includes a base member having a first groove, a gate electrode arranged in the first groove of the base member, a gate insulating layer arranged on the gate electrode and on the base member, the gate insulating layer having a second groove arranged on both sides of the first groove of the base member, source and drain electrodes arranged in the second grooves of the gate insulating layer, and a semiconductor layer arranged on the source and drain electrodes and on the gate insulating layer.

Of still another aspect of the present invention, there is provided a method of manufacturing a thin film transistor, the method including preparing a base member, forming a first groove by etching the base member, forming a gate in the first groove of the base member, forming a gate insulating layer on the gate and the base member, forming second grooves arranged on both sides of the first groove by etching the gate insulating layer, forming source and drain electrodes in the second grooves of the gate insulating layer, and forming a semiconductor layer on the source and drain electrodes and the gate insulating layer.

Of still another aspect of the present invention, there is provided a method of manufacturing a thin film transistor, the method including preparing a base member, forming first grooves spaced from each other by etching the base member, forming source and drain electrodes in the first grooves of the base member, forming a semiconductor layer on the base member and on the source and drain electrodes, forming a gate insulating layer on the semiconductor layer, forming a second groove arranged between the source and drain electrodes by etching the gate insulating layer, and forming a gate electrode in the second groove of the gate insulating layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
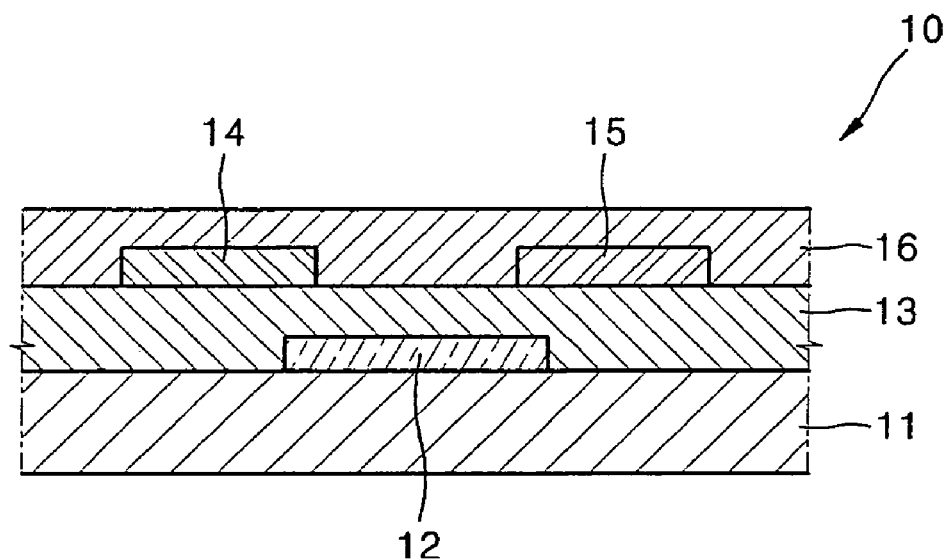
FIG. 1 is a cross-sectional view of an organic thin film transistor.

Turning now to the figures, FIG. 1 shows a cross-sectional view of an organic thin film transistor 10. Referring to FIG. 1, the organic thin film transistor 10 includes a gate electrode 12 formed on a substrate 11, a gate insulating layer 13 formed on the substrate 10 and on the gate electrode 12, source and drain electrodes 14 and 15 formed on the gate insulating layer 13, and a semiconductor layer 16 formed on the source and drain electrodes 14 and 15 and on the gate insulating layer 13.

In the organic thin film transistor 10 of FIG. 1, since conductive patterns such as the gate electrode 12 and the source and drain electrodes 14 and 15 are formed using a photolithography process, there is a disadvantage in that the processes are complex and the processes must be performed at a low temperature due to the small degree of thermal stability of the substrate.

On the other hand, an inkjet method is known as the method of forming a conductive pattern such as the source and drain electrodes 14 and 15 and the gate electrode 12. A method of forming source and drain electrodes by applying an electroless gold plating solution on a substrate in an inkjet method, heating the solution at 90° C. to form a gold thin film pattern is disclosed in Korean Laid Open Patent Publication No. 2004-0029402. As described above, in the method of forming source and drain electrodes by using an inkjet method, the source and drain electrodes are formed by pattern-applying and then curing a solution including a material for the source and drain electrodes on the substrate.

Figure 2:
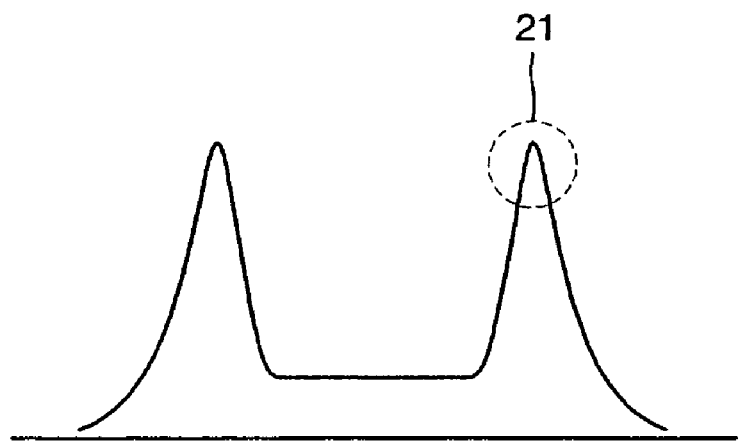
FIG. 2 is a diagram illustrating a problem occurring in forming a conductive pattern by using an inkjet method.

Since the above method of forming source and drain electrodes employs the inkjet method, there is an advantage in that the processes can be simplified and performed at a low temperature due to omission of a photolithography process. However, there is a problem in that pinning points are generated with evaporation of a solvent at the time of applying and then curing the material for the source and drain electrodes and that a coffee stain effect that occurs at edges of the patterns that becomes relatively thick results. Such an effect increases as the evaporation speed of the solvent increases. In addition, when line patterns such as the source and drain electrodes and the gate electrode are printed, the effect becomes more severe, thus forming a sectional profile having protrusions 21 at the edges as shown in FIG. 2.

A thin film transistor having a bottom gate structure has a sectional structure that a gate insulating layer is formed on a gate electrode. Therefore, when the gate electrode is formed using the inkjet method, the thin film transistor has the sectional profile shown in FIG. 2, thus damaging the gate insulating layer formed thereon.

Figure 3A:
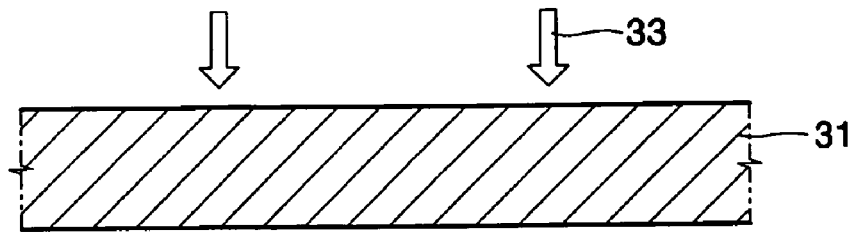
FIGS. 3A to 3D are cross-sectional views illustrating a method of forming a conductive pattern by using a laser ablation method and an inkjet method of an embodiment of the present invention.
Figure 3B:
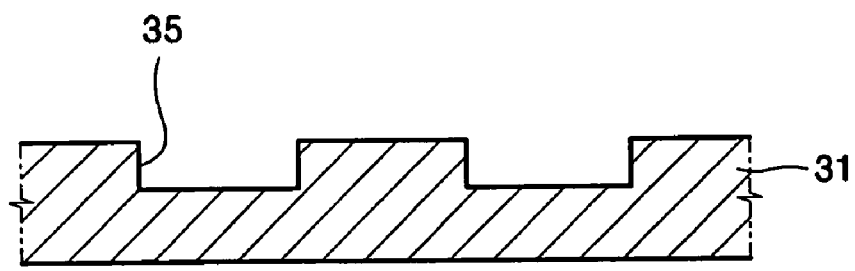

Turning now to FIGS. 3A to 3D, FIGS. 3A to 3D are cross-sectional views illustrating a method of forming a conductive pattern by using laser ablation and an inkjet process of an embodiment of the present invention. Referring now to FIG. 3A, a substrate 31 on which a conductive pattern to be formed is prepared. A laser ablation process is performed by irradiating a laser beam 33 onto a portion on the substrate 31 on which the conductive pattern is to be formed. Referring now to FIG. 3B, the portion on the substrate 31 on which the laser beam 33 is irradiated is etched to form grooves 35 in the substrate 31. An excimer laser beam or a YAG laser beam can be used as the laser beam 33.

The grooves 35 have the same pattern as the conductive pattern to be formed on the substrate 31 and the width and depth of the grooves 35 are determined depending upon the conductive pattern to be formed on the substrate 31. The type and energy of the laser beam 33 are determined depending upon materials making up the substrate and the patterns to be formed on the substrate.

Figure 3C:
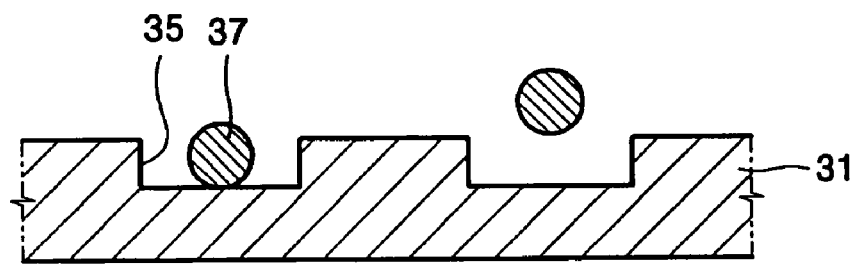

The substrate 31 includes as a plastic substrate a plastic film which is made of one of polyether sulphone (PES), polyacrylate (PAR), polyether imide (PEI), polyethylene napthalate (PEN), polyethylene terepthalate (PET), polyphenylene sulfide (PPS), polyarylate, polyimide, polycarbonate (PC), cellulose triacetate (TAC), and cellulose acetate propinonate (CAP). Subsequently, conductive patterns 39 are formed in the grooves 35 of the substrate 31 by using an inkjet method. Referring now to FIG. 3C, a solution 37 including a conductive material is ejected into the grooves 35 from an inkjet head (not shown in the figures).

Figure 3D:
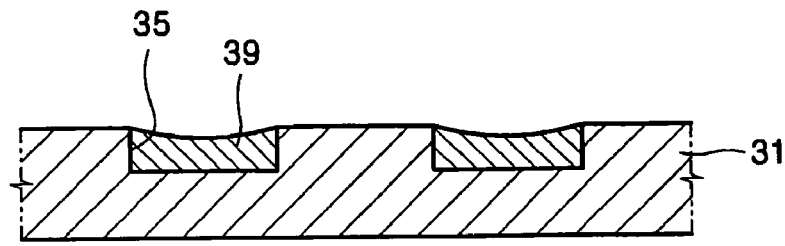

Referring now to FIG. 3D, by performing a curing process, the conductive pattern 39 having a desired pattern is formed in the grooves 35 of the substrate 31. The curing process is performed using ultraviolet radiation or heat.

Here, the conductive pattern 39 includes a nanocomposite such as Ag nanocomposite, Cu nanocomposite, Au nanocomposite, Pt nanocomposite, and carbon nanocomposite. The conductive pattern 39 is formed by applying and then curing an ink containing conductive particles and an organic binder. The conductive particles preferably include either Ag nanoparticles, Cu nanoparticles, Au nanoparticles, Pt nanoparticles, carbon nanoparticles or fine graphite particles.

Of an embodiment of FIGS. 3A to 3D of the present invention, by forming the grooves 35 in the substrate using the laser ablation method and then forming the conductive pattern using the inkjet method, the side walls of the grooves 35 serve as banks in the inkjet method, thus preventing the formation of protrusions at the edges of the conductive pattern 39. By forming the conductive pattern in the substrate 31 without a photolithography process, it is possible to simplify the processes and to form the conductive pattern for an organic electroluminescent display device at low temperatures.

Figure 4A:
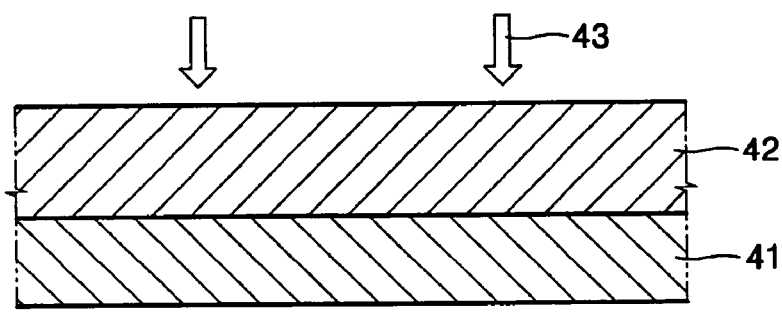
FIGS. 4A to 4D are cross-sectional views illustrating a method of forming a conductive pattern by using a laser ablation method and an inkjet method of another embodiment of the present invention.

Turning now to FIGS. 4A to 4D, FIGS. 4A to 4D are cross-sectional views illustrating a method of forming a conductive pattern by using a laser ablation method and an inkjet method of another embodiment of the present invention. Referring now to FIG. 4A, a substrate 41 is prepared and an insulating layer 42 is formed on the substrate 41. The laser ablation process is performed by irradiating a laser beam 43 onto a portion of the insulating layer 42 in which conductive patterns are to be formed. An excimer laser beam or a YAG laser beam is used as the laser beam 43.

Figure 4B:
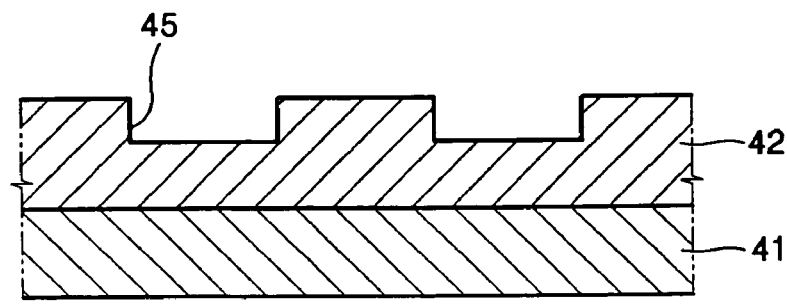
Figure 4C:
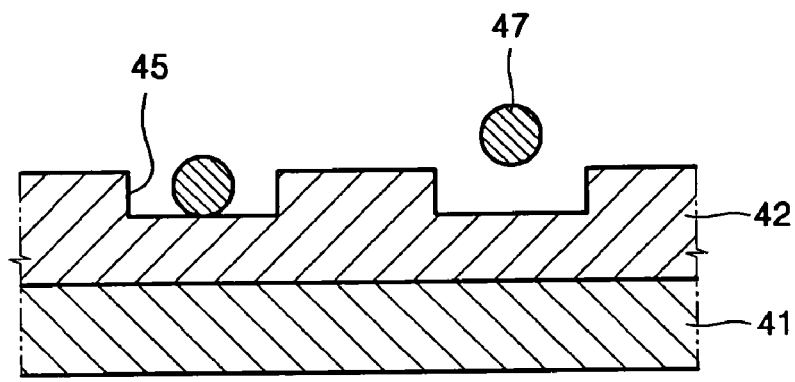

Referring now to FIG. 4B, as a result of the laser ablation process, the portion of the insulating layer 42 irradiated by the laser beam 43 is etched to form grooves 45 in the insulating layer 42. Here, the grooves 45 have the same pattern as the conductive patterns to be formed in the insulating layer 42 and the width and depth of the grooves 45 are determined depending upon the conductive patterns to be formed in the insulating layer 42. The type and energy of the laser beam 43 are determined depending upon materials constituting the insulating layer 42 and patterns to be formed on the insulating layer 42. The thickness of the insulating layer 42 is determined in consideration of the thickness and the insulating characteristics of the conductive pattern to be formed in the subsequent process.

The substrate 41 includes as a plastic substrate a plastic film which is made of one of polyether sulphone (PES), polyacrylate (PAR), polyether imide (PEI), polyethylene napthalate (PEN), polyethylene terepthalate (PET), polyphenylene sulfide (PPS), polyarylate, polyimide, polycarbonate (PC), cellulose triacetate (TAC), and cellulose acetate propinonate (CAP).

The insulating layer 42 includes an inorganic insulating layer or an organic insulating layer. When the method of forming a conductive pattern of an embodiment of the present invention is applied to an organic thin film transistor, the insulating layer 42 can include a gate insulating layer. The insulating layer 42 includes as the inorganic insulating layer one or more of $SiO_2$, $SiN_x$, $Al_2O_3$, $Ta_2O_5$, BST, and PZT. In addition, the insulating layer 42 includes as the organic insulating layer one or more of polymethyl methacrylate (PMMA), polystyrene (PS), phenol polymer, acryl polymer, imide polymer such as polyimide, arylether polymer, amide polymer, fluoride polymer, p-xylene polymer, vinylalcohol polymer, and parylene.

Instead of to the laser ablation method, a method using a solvent can be used to form the grooves 45 in the insulating layer 42. To form groove 45 using a solvent, the insulating layer 42 is first formed on the substrate 41. The insulating layer 42 is then soft-baked at about 80° C., and a surface treatment is performed using a carbon tetrafluoride ($CF_4$) plasma process, a hexamethyldisiloxane (HMDSO) plasma process, a self assembled monolayer process, or the like so as to adjust the surface energy thereof.

Subsequently, a solvent is poured onto a location where the grooves 45 are to be formed and the insulating layer 42 is etched by the solvent, thus forming the grooves 45. Here, the width and depth of the grooves 45 can be controlled by adjusting the amount of solvent poured to form the grooves 45. That is, by adjusting the distance between a nozzle ejecting the solvent and the insulating layer 42, the amount of solvent applied, the amount of solvent to be poured at a time, the width and depth of the grooves 45 can be controlled. For example, if the distance between the nozzle ejecting the solvent and the insulating layer 42 increases, the solvent is more widely spread on the insulating layer 42, thus increasing the width of the grooves 45.

When the insulating layer 42 is etched to form the grooves 45 by using the solvent, it is necessary to prevent the solvent poured onto the insulating layer 42 from being spread too widely. That is, when the surface of the insulating layer 42 is smooth and thus the solvent is widely spread, the width of the grooves 45 formed in the insulating layer 42 increases. Therefore, in order to form the grooves 45 having a small width, it is necessary to prevent the solvent poured onto the insulating layer 42 from being spread too widely. The surface treatment described above is performed for this purpose. That is, by performing the surface treatment on the insulating layer 42 before pouring the solvent onto the insulating layer 42 to form the grooves 45, the solvent can be prevented from spreading too widely on the insulating layer 42.

Subsequently, the conductive pattern 49 is formed in the grooves 45 of the insulating layer 42 by using an inkjet method. That is, referring now to FIG. 4C, the solution 47 containing the conductive material is ejected in a desired pattern into the grooves 45 of the insulating layer 42 from an inkjet head (not shown in the figures). The curing process can be performed using heat or ultraviolet rays.

Figure 4D:
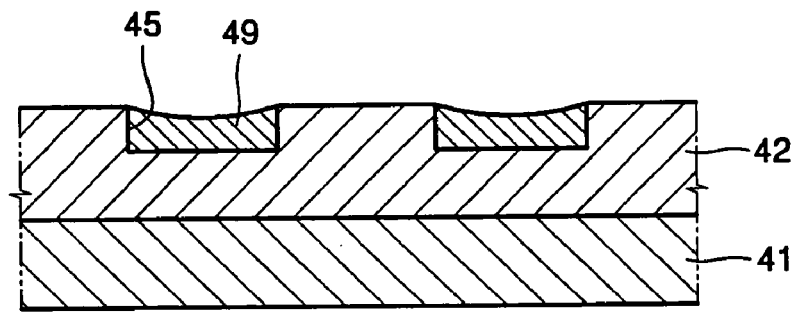

Referring now to FIG. 4D, the curing process is next performed to form the conductive pattern 49 in the grooves 45 of the insulating layer 42. The curing process can be performed using heat or ultraviolet rays.

Here, the conductive pattern 49 contains one or more of Ag nanocomposite, Cu nanocomposite, Au nanocomposite, Pt nanocomposite, and carbon nanocomposite. The conductive pattern 49 can be formed by pouring and then curing an ink containing conductive particles and organic binders. The conductive particles include particles selected from Ag nanoparticles, Cu nanoparticles, Au nanoparticles, Pt nanoparticles, carbon nanoparticles, and fine graphite particles.

Of another embodiment of the present invention, by forming the grooves 45 in the insulating layer 42 on the substrate 41 via the laser ablation method or the etching method using a solvent and then forming the conductive pattern 49 via the inkjet application of the conductive material, the side walls of the grooves 45 serve as banks in an inkjet method, thus preventing the formation of protrusions at the edges of the conductive pattern 49. In addition, by forming the conductive pattern in the insulating layer 42 without using a photolithography process, it is possible to simplify the processes and to form an organic electroluminescent display device via only low-temperature processes.

Figure 5A:
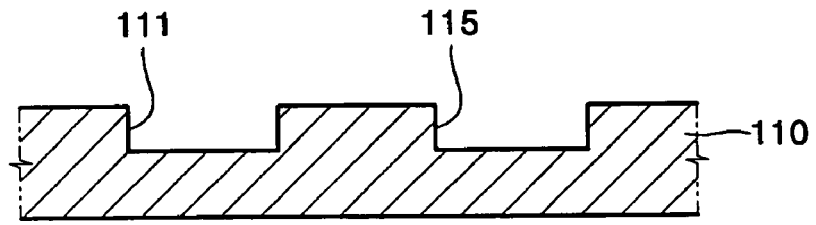
FIGS. 5A to 5F are cross-sectional views illustrating a method of manufacturing an organic thin film transistor of a first embodiment of the present invention.

Turning now to FIGS. 5A to 5F, FIGS. 5A to 5F are cross-sectional views illustrating a method of manufacturing an organic thin film transistor of a first embodiment of the present invention. Referring now to FIG. 5A, a substrate 110 on which an organic thin film transistor is to be formed is prepared. The substrate 110 includes as a plastic substrate a plastic film which is made of one of polyether sulphone (PES), polyacrylate (PAR), polyether imide (PEI), polyethylene napthalate (PEN), polyethylene terepthalate (PET), polyphenylene sulfide (PPS), polyarylate, polyimide, polycarbonate (PC), cellulose triacetate (TAC), and cellulose acetate propinonate (CAP).

Subsequently, a laser beam is irradiated onto the substrate 110 through the laser ablation process and a portion of the substrate 110 in which source and drain electrodes are to be formed is etched, thus forming grooves 111 and 115 in the substrate 110. An excimer laser beam or a YAG laser beam is used in the laser ablation process.

Here, the grooves 111 and 115 have the same pattern as the source and drain electrodes to be formed and the size of the grooves 111 and 115 is determined depending upon the size of the source and drain electrodes to be formed. The type and energy of the laser beam are determined depending upon materials making up the substrate and electrode materials to be formed on the substrate.

Figure 5B:
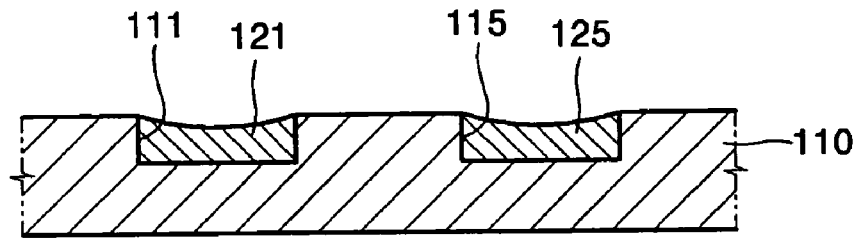

Referring now to FIG. 5B, source and drain electrodes 121 and 125 are formed in the grooves 111 and 115 of the substrate 110 by using an inkjet method. That is, a solution containing the source and drain electrode material is ejected into the grooves 111 and 115 of the substrate 110 from an inkjet head (not shown in the figures) and then is cured, thus forming the source and drain electrodes 121 and 125. The source and drain electrodes 121 and 125 can include a Au nanocomposite or a Pt nanocomposite.

The source and drain electrodes 121 and 125 are formed by applying and then curing an ink containing metal nanoparticles or carbon nanoparticles and organic binders. The metal nanoparticles can include metal nanoparticles having a work function greater than the value obtained by subtracting 0.5 eV from an HOMO (Highest Occupied Molecular Orbital) value of the organic semiconductor layer to be formed in the subsequent process, that is, a work function greater than (HOMO value of the organic semiconductor layer −0.5 eV), and can preferably include Au nanoparticles or Pt nanoparticles.

Figure 5C:
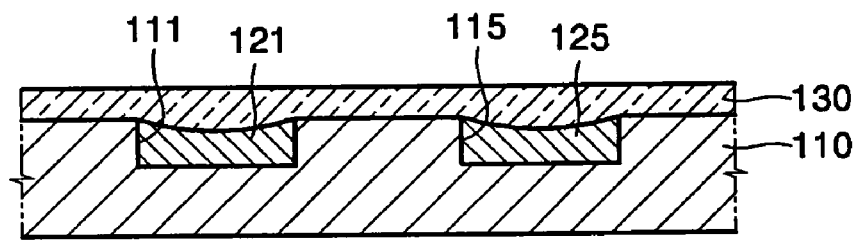
Figure 5D:
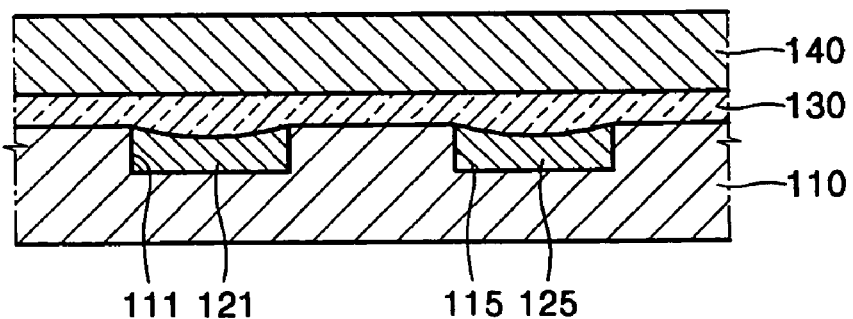

Referring now to FIG. 5C, the semiconductor layer 130 is formed on the substrate 110 including on the source and drain electrodes 121 and 125. In the embodiment of FIGS. 5A to 5F, the semiconductor layer is formed on the whole surface of the substrate, but the present invention is in no way so limited. A channel layer of the organic thin film transistor can be separated from that of an adjacent thin film transistor by patterning the semiconductor layer 130.

The semiconductor layer 130 includes an organic semiconductor layer. The semiconductor layer 130 includes at least one organic layer made of either pentacene, tetracene, anthracene, naphthalene, α-6-thiophene, perylene and derivatives thereof, rubrene and derivatives thereof, coronene and derivatives thereof, perylene tetracarboxylic diimide and derivatives thereof, perylene tetracarboxylic dianhydride and derivatives thereof, polythiophene and derivatives thereof, polyparaperylenevinylene and derivatives thereof, polyflorene and derivatives thereof, polythiophenevinylene and derivatives thereof, polyparaphenylene and derivatives, polythiophene-hetero cyclic aromatic copolymer and derivatives thereof, oligoacene of naphthalene and derivatives thereof, oligothiophene of α-5-thiophene and derivatives, phthalocyanine containing or not containing metal and derivatives thereof, pyromellitic dianhydride and derivatives thereof, pyromellitic diimide and derivatives, perylene tetracarboxylic dianhydride and derivatives thereof, naphthalene tetracarboxylic diimide and derivatives or naphthalene tetracarboxylic dianhydride and derivatives thereof Referring now to FIG. 5D, a gate insulating layer 140 is formed on the semiconductor layer 130. The thickness of the gate insulating layer 140 is determined in consideration of the insulating characteristic of the thin film transistor and the characteristic of the gate electrode. The gate insulating layer 140 includes an organic insulating layer made of one of benzocyclobutene (BCB), polyimide, parylene, and polyvinylphenol (PVP). In addition, the gate insulating layer 140 can include an insulating material selected from the insulating layer (42 in FIG. 4A) used in the above-mentioned embodiment of the present invention.

Figure 5E:
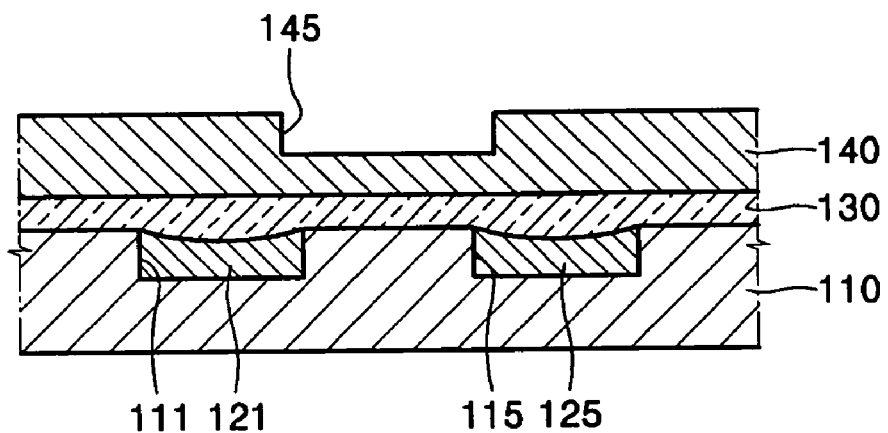

Referring now to FIG. 5E, grooves 145 are formed in the gate insulating layer 140 by irradiating a laser beam onto the gate insulating layer 140 via the laser ablation method. The grooves 145 have the same pattern as the gate electrode to be formed in the subsequent process. An excimer laser beam or a YAG laser beam can be used for the laser ablation process.

The grooves 145 can be formed in the insulating layer 140 by using a solvent, instead of using the laser ablation method. When solvent etching is employed, the insulating layer 140 is soft-baked at about 80° C., and is subjected to a surface treatment so as to adjust its surface energy 18 after formation. The surface treatment is performed using a carbon tetrafluoride ($CF_4$) plasma process, a hexamethyldisiloxane (HMDSO) plasma process, a self assembled monolayer process, or the like.

Subsequently, a solvent is poured onto the portion in which the grooves 145 should be formed and the insulating layer 140 is etched with the solvent, thus forming the grooves 145. When a solvent is used to etch, the width and depth of the grooves 145 are controlled by adjusting the amount of solvent to be poured for forming the grooves 145.

Figure 5F:
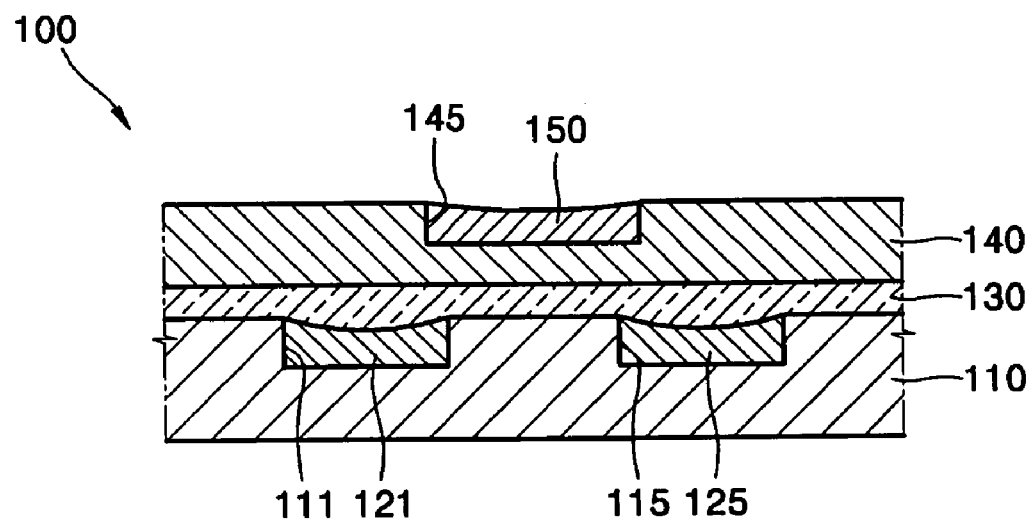

Referring now to FIG. 5F, a gate electrode 150 is formed by pouring a solution containing a gate electrode material into the grooves 145 of the gate insulating layer 140 from an inkjet head (not shown in the figure) via the inkjet method and then curing the solution. Accordingly, a top gate type organic thin film transistor 100 of the first embodiment of the present invention is manufactured. Here, the gate electrode 150 contains a nanocomposite such as Ag nanocomposite, Cu nanocomposite, Au nanocomposite, Pt nanocomposite or carbon nanocomposite.

The gate electrode 150 can be formed by pouring an ink containing conductive particles and organic binders and then baking the ink. The conductive particles can include particles such as Ag nanoparticles, Cu nanoparticles, Au nanoparticles, Pt nanoparticles, carbon nanoparticles or fine graphite particles.

In the method of manufacturing an organic thin film transistor having a top gate structure of the first embodiment of FIGS. 5A through 5F, it has been exemplified that the source and drain electrodes as well as the gate electrode are made by forming grooves in the substrate and in the gate insulating layer. However, the present invention is in no way limited to this. Alternatively, the gate electrode can be formed in a groove of the gate insulating layer and the source and drain electrodes can be formed on the substrate and not in grooves in the substrate, and still be within the scope of the present invention. Conversely, the source and drain electrodes can be formed in grooves in the substrate and the gate electrode can be formed on the gate insulating layer as opposed to being formed in a groove in the gate insulating layer and also still be within the scope of the present invention.

Figure 6A:
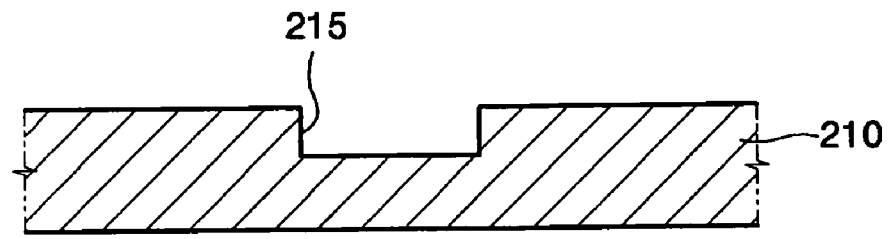
FIGS. 6A to 6F are cross-sectional views illustrating a method of manufacturing an organic thin film transistor of a second embodiment of the present invention.

Turning now to FIGS. 6A to 6F, FIGS. 6A to 6F are cross-sectional views illustrating a method of manufacturing an organic thin film transistor of a second embodiment of the present invention. Referring now to FIG. 6A, a substrate 210 on which an organic thin film transistor will be formed is prepared. The substrate 210 includes as a plastic substrate a plastic film which is made of one of polyether sulphone (PES), polyacrylate (PAR), polyether imide (PEI), polyethylene napthalate (PEN), polyethylene terepthalate (PET), polyphenylene sulfide (PPS), polyarylate, polyimide, polycarbonate (PC), cellulose triacetate (TAC), and cellulose acetate propionates (CAP).

Subsequently, a laser beam is irradiated onto the substrate 210 via the laser ablation process and a portion of the substrate 210 in which a gate electrode is to be formed is etched, thus forming grooves 215 in the substrate 210. An excimer laser beam or a YAG laser beam is used as the laser beam. Here, the grooves 215 have the same pattern as the gate electrode to be formed and the size of the grooves 215 are determined depending upon the size of the gate electrode to be formed. The type and energy of the laser beam are determined depending upon materials making up the substrate and upon the gate electrode materials to be formed on the substrate.

Figure 6B:
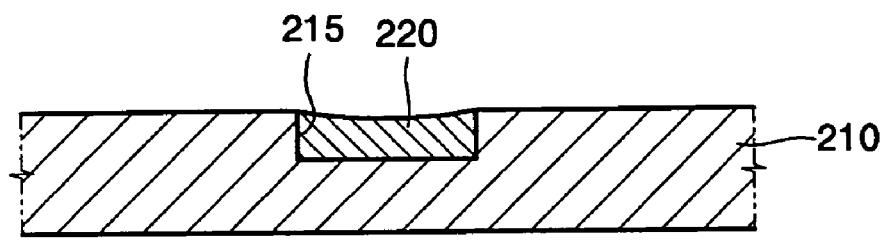

Referring now to FIG. 6B, a gate electrode 220 is formed in the grooves 215 of the substrate 210 by pouring a solution containing the gate electrode material into the grooves 215 from an inkjet head (not shown in the figure) and curing the solution. The gate electrode 220 includes nanocomposite such as Ag nanocomposite, Cu nanocomposite, Au nanocomposite, Pt nanocomposite or carbon nanocomposite. The gate electrode 220 can be formed by applying and then curing an ink containing conductive particles and organic binders. The conductive particles can be Ag nanoparticles, Cu nanoparticles, Au nanoparticles, Pt nanoparticles, carbon nanoparticles or fine graphite nanoparticles.

Figure 6C:
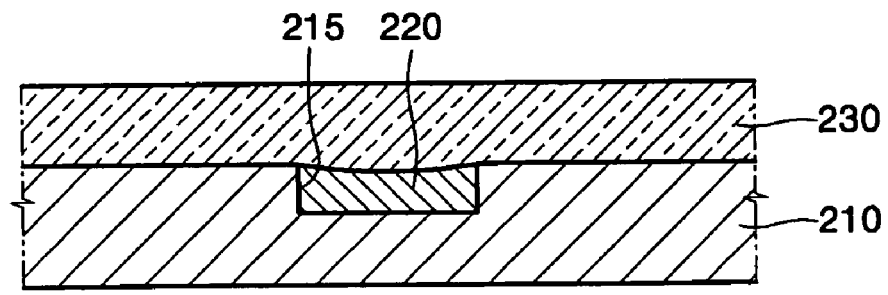

Referring now to FIG. 6C, a gate insulating layer 230 is formed on the gate electrode 220 and on the substrate 210. The gate insulating layer 230 includes an organic insulating layer such as benzocyclobutene (BCB), polyimide, parylene or polyvinylphenol (PVP). In addition, the gate insulating layer 230 can include the insulating layer 42 as illustrated and described in conjunction with FIG. 4A.

Figure 6D:
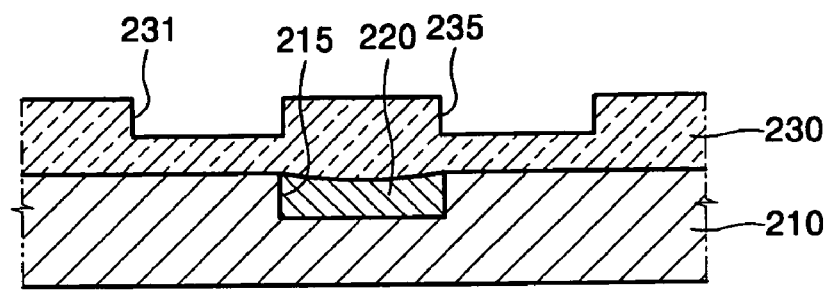

Referring now to FIG. 6D, grooves 231 and 235 are formed in portions of the gate insulating layer 230 on which the source and drain electrodes are to be formed by irradiating a laser beam into the gate insulating layer 230 via the laser ablation method. The grooves 231 and 235 have the same pattern as the source and drain electrodes to be formed in the subsequent process. An excimer laser beam or a YAG laser beam is used as the laser beam.

Figure 6E:
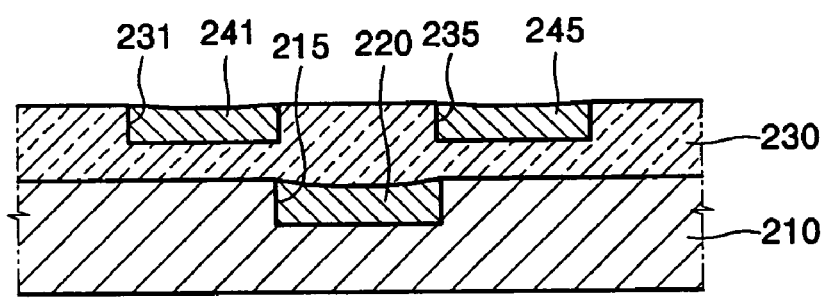

Referring now to FIG. 6E, source and drain electrodes 241 and 245 are formed in the grooves 231 and 235 of the gate insulating layer 230 by pouring a solution containing an electrode material into the grooves 231 and 235 of the gate insulating layer 230 from an inkjet head (not shown in the figure) via the inkjet method and then curing the solution. The source and drain electrodes 242 and 245 contain Au nanocomposite or Pt nanocomposite.

The source and drain electrodes 241 and 245 can be formed by pattern-applying and then baking an ink containing organic binders and carbon nanoparticle or metal nanoparticle having a work function greater than the value obtained by subtracting 0.5 eV from an HOMO (Highest Occupied Molecular Orbital) value of the organic semiconductor layer to be formed in the subsequent process, that is, a work function greater than (HOMO value of the organic semiconductor layer −0.5 eV). The metal nanoparticles includes Au nanoparticles or Pt nanoparticles.

Figure 6F:
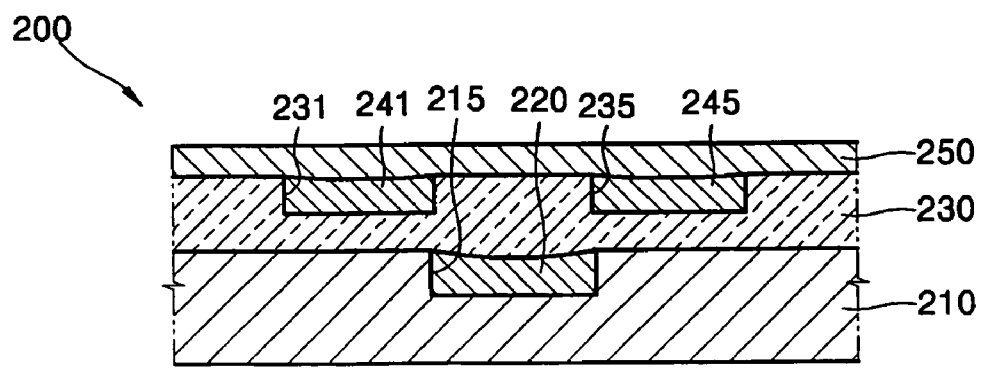

Referring now to FIG. 6F, a semiconductor layer 250 is formed on the source and drain electrodes 241 and 245 and on the gate insulating layer 230. In the second embodiment of FIGS. 6A to 6F, it has been exemplified that the semiconductor layer 250 is formed on the whole surface of the substrate, but is not limited there. A channel layer of one thin film transistor can be separated from an adjacent thin film transistor by patterning the semiconductor layer 250. In this way, a bottom gate type organic thin film transistor 200 of the second embodiment is formed.

The semiconductor layer 250 includes an organic semiconductor layer. The semiconductor layer 250 includes at least one organic layer made of one of pentacene, tetracene, anthracene, naphthalene, α-6-thiophene, perylene and derivatives thereof, rubrene and derivatives thereof, coronene and derivatives thereof, perylene tetracarboxylic diimide and derivatives thereof, perylene tetracarboxylic dianhydride and derivatives thereof, polythiophene and derivatives thereof, polyparaperylenevinylene and derivatives thereof, polyflorene and derivatives thereof, polythiophenevinylene and derivatives thereof, polyparaphenylene and derivatives, polythiophene-hetero cyclic aromatic copolymer and derivatives thereof, oligoacene of naphthalene and derivatives thereof, oligothiophene of α-5-thiophene and derivatives, phthalocyanine containing or not containing metal and derivatives thereof, pyromellitic dianhydride and derivatives thereof, pyromellitic diimide and derivatives, perylene tetracarboxylic dianhydride and derivatives thereof, naphthalene tetracarboxylic diimide and derivatives, and naphthalene tetracarboxylic dianhydride and derivatives thereof.

In the method of manufacturing an organic thin film transistor having a bottom gate structure of FIGS. 6A to 6F, it has been exemplified that the source and drain electrodes as well as the gate electrode are made by forming grooves in the substrate and in the gate insulating layer. However, the present invention is in no way limited to this. Alternatively, the gate electrode can be formed in a groove of the gate insulating layer and the source and drain electrodes can be formed on the substrate and not in grooves in the substrate, and still be within the scope of the present invention. Conversely, the source and drain electrodes can be formed in grooves in the substrate and the gate electrode can be formed on the gate insulating layer as opposed to being formed in a groove in the gate insulating layer and also still be within the scope of the present invention.

Figure 7A:
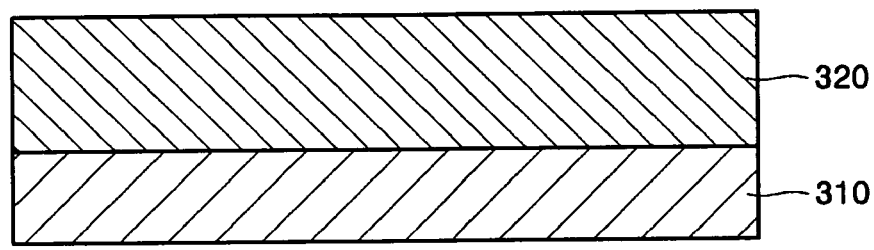
FIGS. 7A to 7G are cross-sectional views illustrating a method of manufacturing an organic thin film transistor of a third embodiment of the present invention.

Turning now to FIGS. 7A to 7G, FIGS. 7A to 7G are cross-sectional views illustrating a method of manufacturing an organic thin film transistor of a third embodiment of the present invention. Referring now to FIG. 7A, a buffer layer 320 is formed on a substrate 310. The buffer layer 320 serves to maintain a planar property of the substrate 310 and to prevent impurities from infiltrating into a thin film transistor to be formed later on the substrate 310 from the substrate 310. After forming and soft-baking the buffer layer 320 at about 80° C., a surface treatment is performed thereto using a carbon tetrafluoride ($CF_4$) plasma process, a hexamethyldisiloxane (HMDSO) plasma process, a self assembled monolayer process, or the like so as to adjust the surface energy thereof. The surface treatment is performed to prevent an etching solvent from spreading on the buffer layer 320 too far by increasing the contact angle between the solvent and the buffer layer 320 when the solvent is poured onto the buffer layer 320 to form predetermined grooves.

Figure 7B:
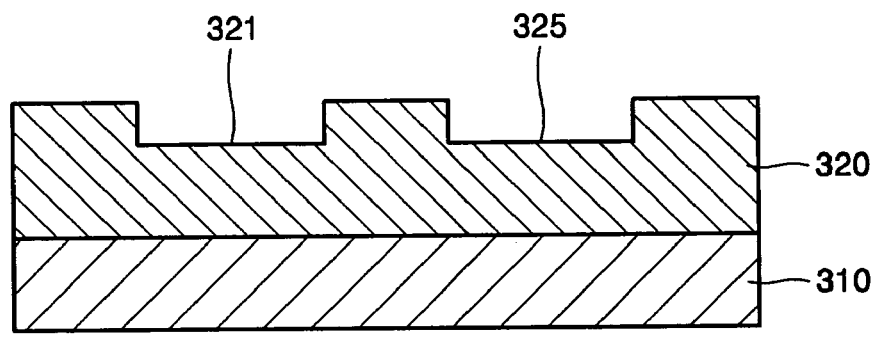

Referring now to FIG. 7B, grooves 321 and 325 spaced apart from each other are formed in the buffer layer 320. Similar to the first and second embodiments, the grooves 321 and 325 can be formed by etching the buffer layer 320 via laser ablation method or by pouring the solvent onto the buffer layer 320 to etch the buffer layer 320. When a solvent is used to etch, the width and depth of the grooves 321 and 325 can be adjusted by adjusting the amount of solvent poured. When the grooves 321 and 325 are formed via the laser ablation method, the surface treatment processes can be omitted.

Figure 7C:
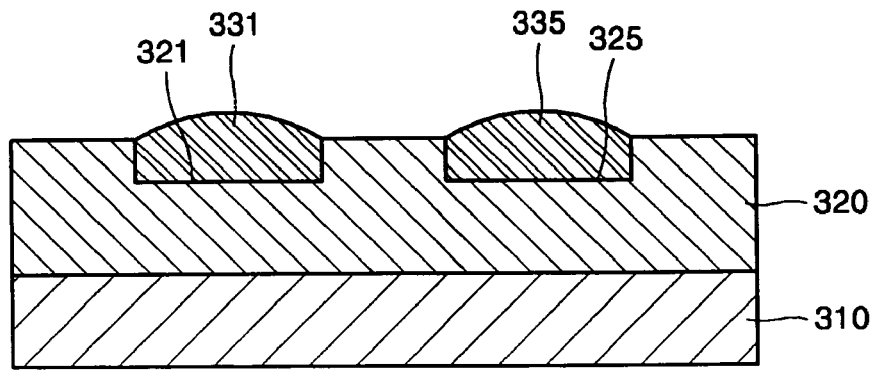

Referring now to FIG. 7C, a source electrode 331 and a drain electrode 335 are formed in the grooves 321 and 325 of the buffer layer 320, respectively. The source electrode 331 and the drain electrode 335 are formed out of a conductive nanocomposite such as Au nanocomposite and Pt nanocomposite via the inkjet method, similar to the above-mentioned embodiments.

Figure 7D:
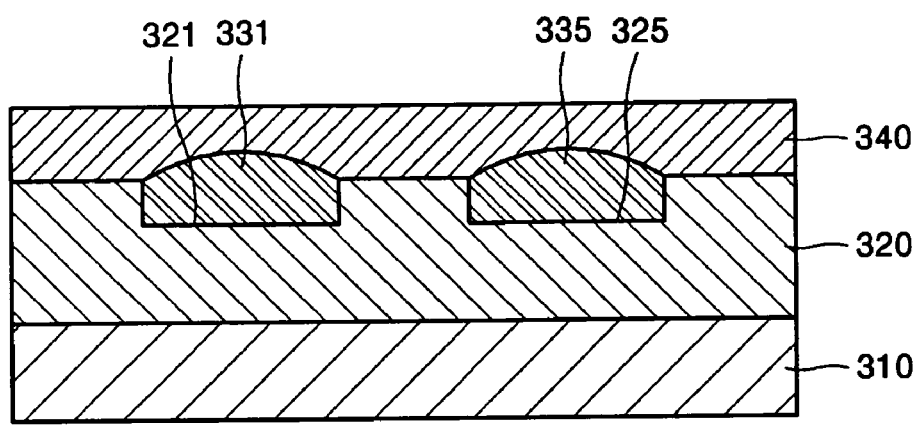

Referring now to FIG. 7D, a semiconductor layer 340 is formed on the substrate so as to come in contact with the source electrode 331 and the drain electrode 335. The semiconductor layer 340 is made out of the above-mentioned organic semiconductor material and can be formed viaa dipping method or a spin coating method.

Figure 7E:
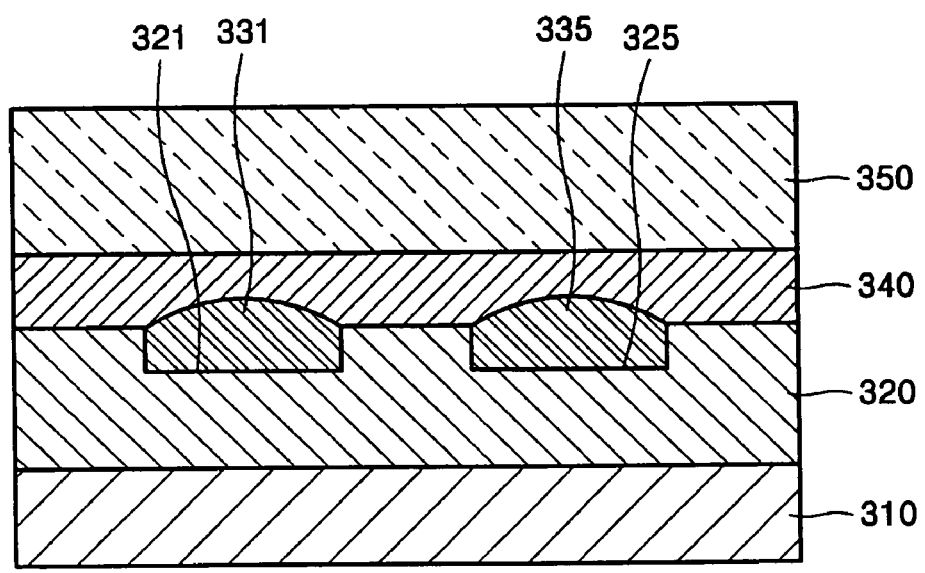

Referring now to FIG. 7E, a gate insulating layer 350 is formed on the semiconductor layer 340. The gate insulating layer 350 includes an organic insulating layer made of a material such as benzocyclobutene (BCB), polyimide, parylene or polyvinylphenol (PVP). In addition, the gate insulating layer 350 can include an insulating material used in the insulating layer 42 of FIG. 4A of the present invention.

Figure 7F:
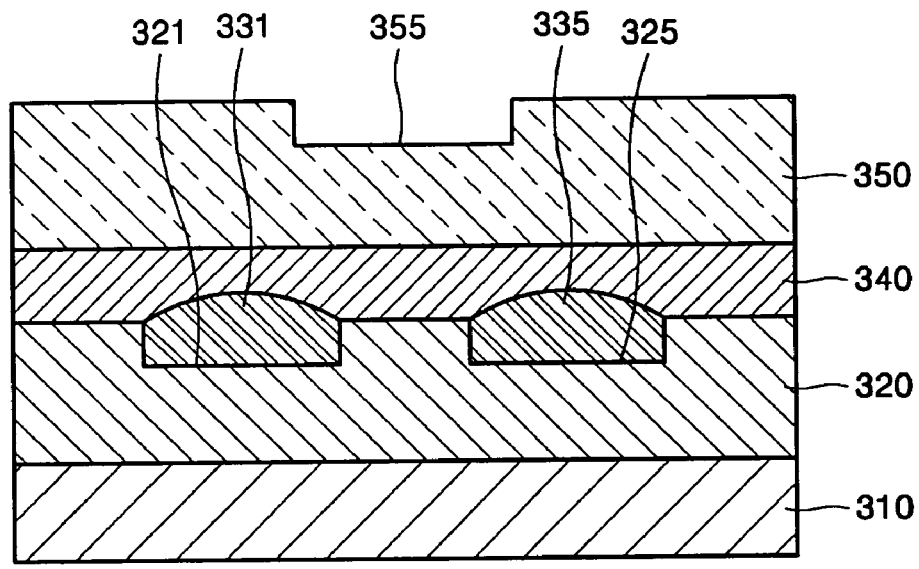

Referring now to FIG. 7F, a groove 355 is formed in the gate insulating layer 350. The groove 355 is formed to correspond to a channel region between the source electrode 331 and the drain electrode 335. Similar to the method of forming the grooves 321 and 325, the groove 355 can be formed by etching the gate insulating layer 350 with the solvent after performing the surface treatment to the gate insulating layer 350 or by etching the gate insulating layer via the laser ablation method. When the groove 355 is formed via the laser ablation method, the surface treatment can be omitted.

Figure 7G:
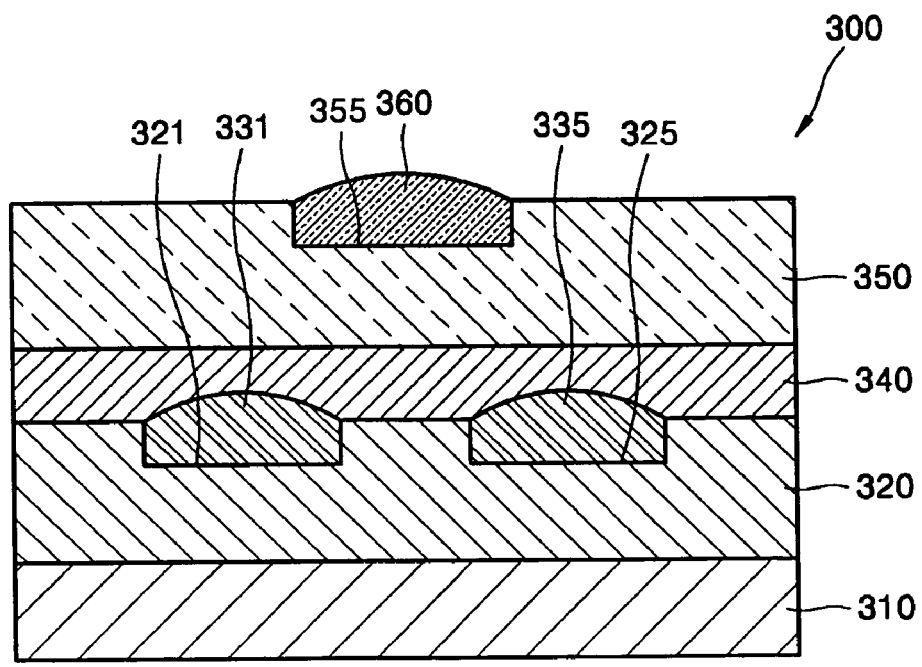

Referring now to FIG. 7G, a gate electrode 360 is formed in the groove 355. The gate electrode 360 includes particles such as Ag nanoparticles, Cu nanoparticles, Au nanoparticles, Pt nanoparticles, carbon nanoparticles or fine graphite particles. In the third embodiment of FIGS. 7A to 7G, it has been exemplified that the source and drain electrodes as well as the gate electrode are made by forming grooves in the substrate and in the gate insulating layer. However, the present invention is in no way limited to this. Alternatively, the gate electrode can be formed in a groove of the gate insulating layer and the source and drain electrodes can be formed on the substrate and not in grooves in the substrate, and still be within the scope of the present invention. Conversely, the source and drain electrodes can be formed in grooves in the substrate and the gate electrode can be formed on the gate insulating layer as opposed to being formed in a groove in the gate insulating layer and also still be within the scope of the present invention.

Figure 8A:
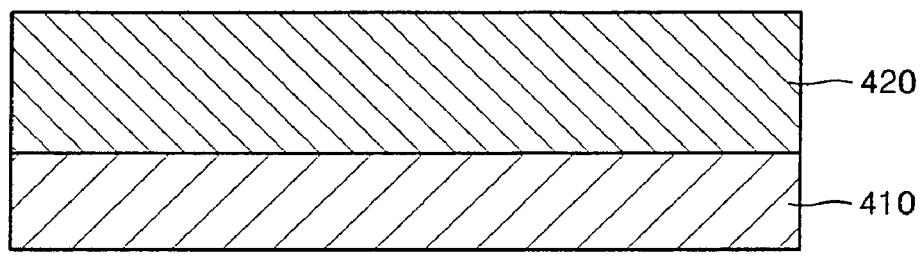
FIGS. 8A to 8G are cross-sectional views illustrating a method of manufacturing an organic thin film transistor of a fourth embodiment of the present invention.

Turning now to FIGS. 8A to 8G, FIGS. 8A to 8G are cross-sectional views illustrating a method of manufacturing an organic thin film transistor of a fourth embodiment of the present invention. Referring now to FIG. 8A, a buffer layer 420 is formed on a substrate 410. The buffer layer 420 serves to maintain a planar property of the substrate 410 and to prevent impurities from infiltrating into a thin film transistor to be formed later from the substrate 410. Other insulating materials for forming grooves can be used instead of the buffer layer 420. After forming and soft-baking the buffer layer 420 at about 80° C., a surface treatment is performed thereto using a carbon tetrafluoride ($CF_4$) plasma process, a hexamethyldisiloxane (HMDSO) plasma process, a self assembled monolayer process, or the like so as to adjust the surface energy thereof. The surface treatment is performed to prevent a solvent from spreading on the buffer layer 420 too far by increasing the contact angle between the solvent and the buffer layer 420 when the solvent is poured onto the buffer layer 420 to form predetermined grooves.

Figure 8B:
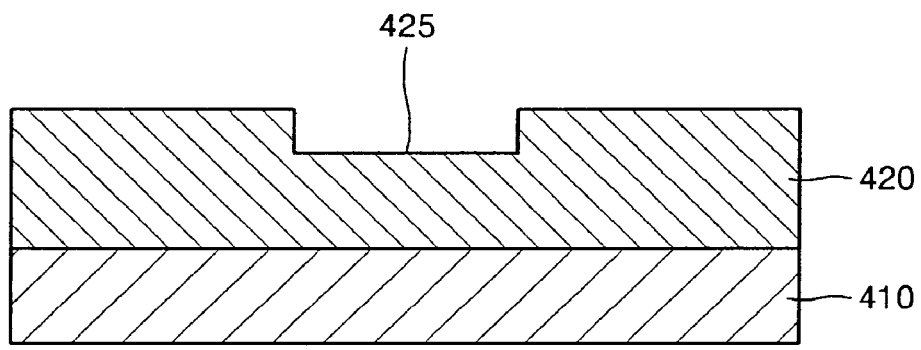

Referring now to FIG. 8B, a groove 425 is formed in the buffer layer 420. Similar to the third embodiment, the groove 425 can be formed by etching the buffer layer 420 by the laser ablation method or by pouring a solvent onto the buffer layer 420. When a solvent is used to etch, the width and depth of the groove 425 can be controlled by adjusting the amount of solvent. When the groove 425 is formed via the laser ablation method, the surface treatment can be omitted.

Figure 8C:
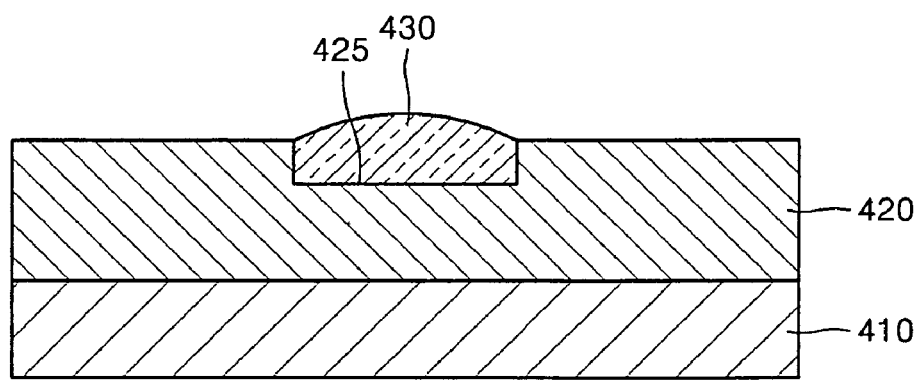

Referring now to FIG. 8C, a gate electrode 430 is formed in the groove 425 in the buffer layer 420. The gate electrode 430 contains one of Ag nanoparticles, Cu nanoparticles, Au nanoparticles, Pt nanoparticles, carbon nanoparticles, and fine graphite particles.

Figure 8D:
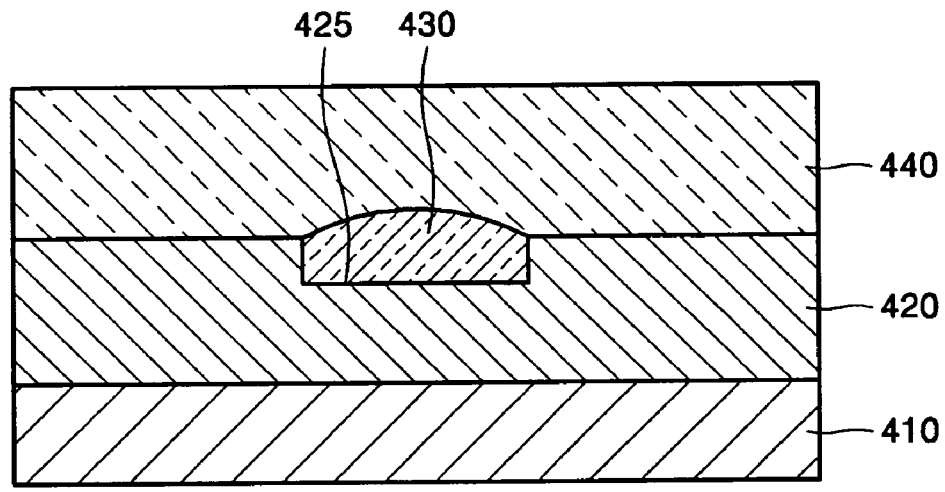

Referring now to FIG. 8D, a gate insulating layer 440 is formed on the substrate. The gate insulating layer 440 includes an organic insulating layer made of one of benzocyclobutene (BCB), polyimide, parylene, and polyvinylphenol (PVP). In addition, the gate insulating layer 440 can include an insulating material used in the insulating layer 42 of FIG. 4A of the present invention.

Figure 8E:
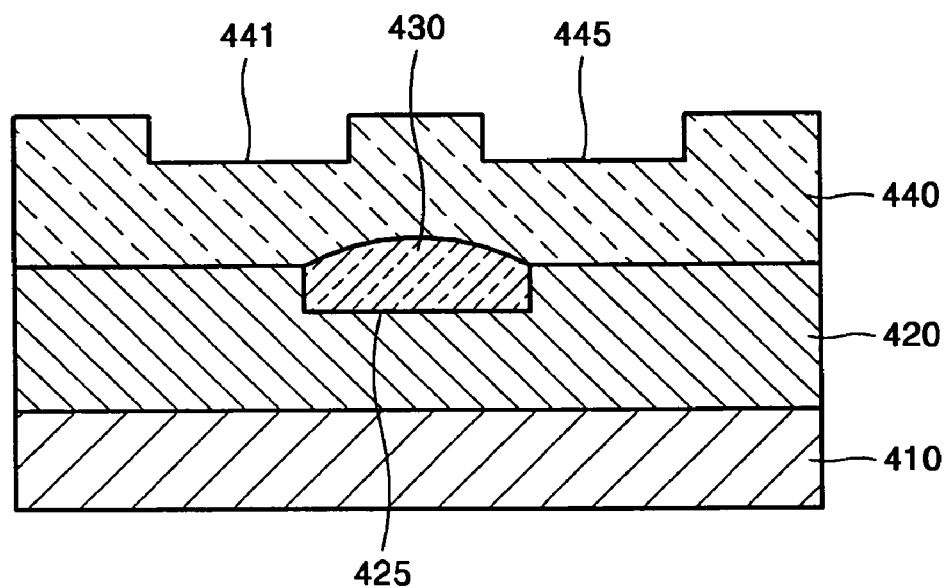

Referring now to FIG. 8E, by etching the gate insulating layer 440, grooves 441 and 445 are formed in portions corresponding to both sides of the gate electrode 430 to overlap with the gate electrode 430. Similar to the third embodiment, the grooves 441 and 445 can be formed by etching the gate insulating layer 440 via the laser ablation method or by pouring a solvent into the gate insulating layer 440 to etch the gate insulating layer 440. When a solvent is used to etch, the width and depth of the grooves 441 and 445 can be controlled by adjusting the amount of the solvent poured. When the grooves 441 and 445 are formed via the laser ablation method, the surface treatment can be omitted.

Figure 8F:
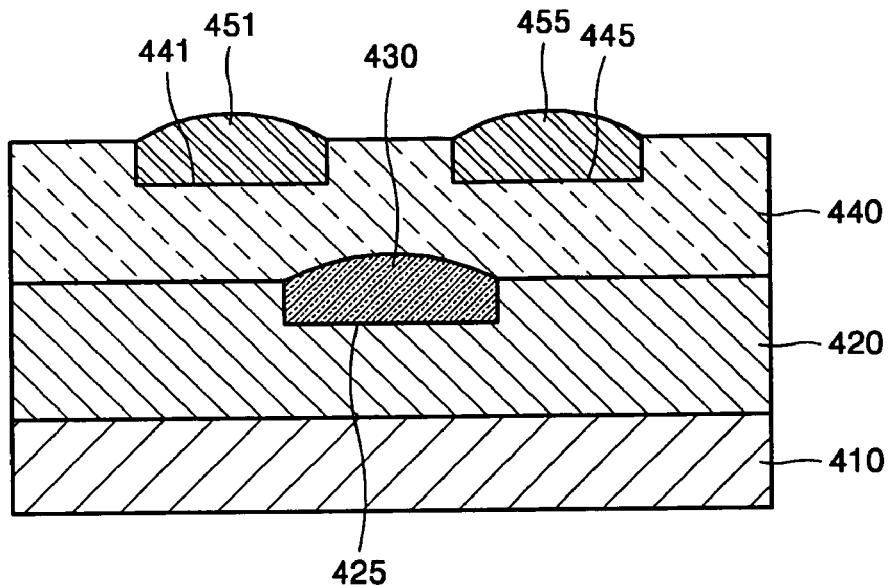

Referring now to FIG. 8F, a source electrode 451 and a drain electrode 455 are formed in the grooves 441 and 445 of the gate insulating layer 440. The source electrode 451 and the drain electrode 455 are formed, similar to the above-mentioned embodiments, out of conductive nanocomposite such as Au nanocomposite and Pt nanocomposite via an inkjet method.

Figure 8G:
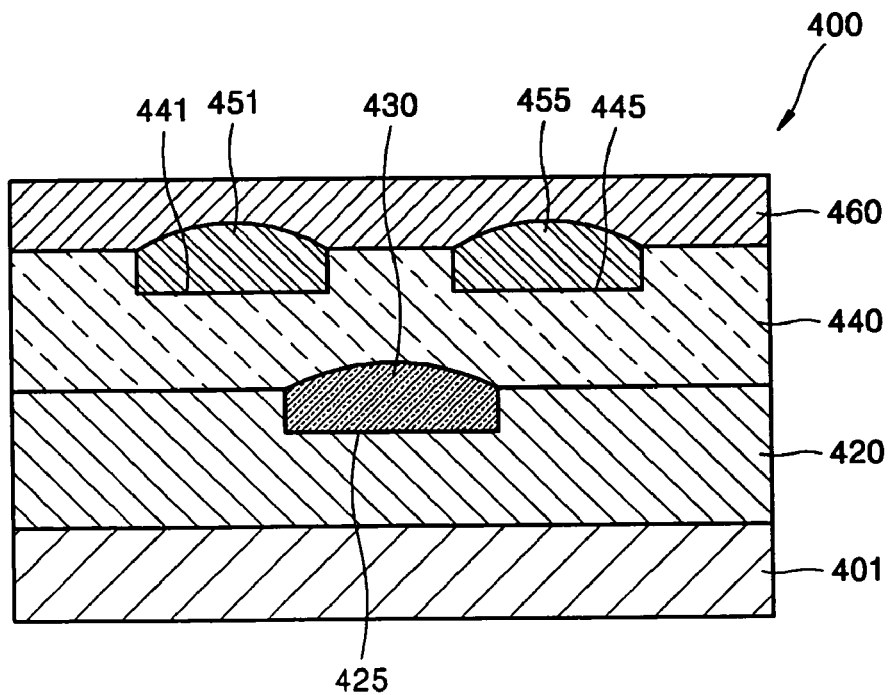

Referring now to FIG. 8G, a semiconductor layer 460 is formed on the substrate to come in contact with the source electrode 451 and the drain electrode 455. The semiconductor layer 460 is made of the above-mentioned organic semiconductor material and can be formed by a dipping method or a spin coating method.

In the fourth embodiment of FIGS. 8A to 8G, it has been exemplified that the gate electrode and the source and drain electrodes are formed by forming the grooves in the buffer layer and the gate insulating layer, respectively. However, the gate electrode can be formed by forming the grooves only in the buffer layer or the source and drain electrodes can be formed by forming the grooves only in the gate insulating layer.

Figure 9:
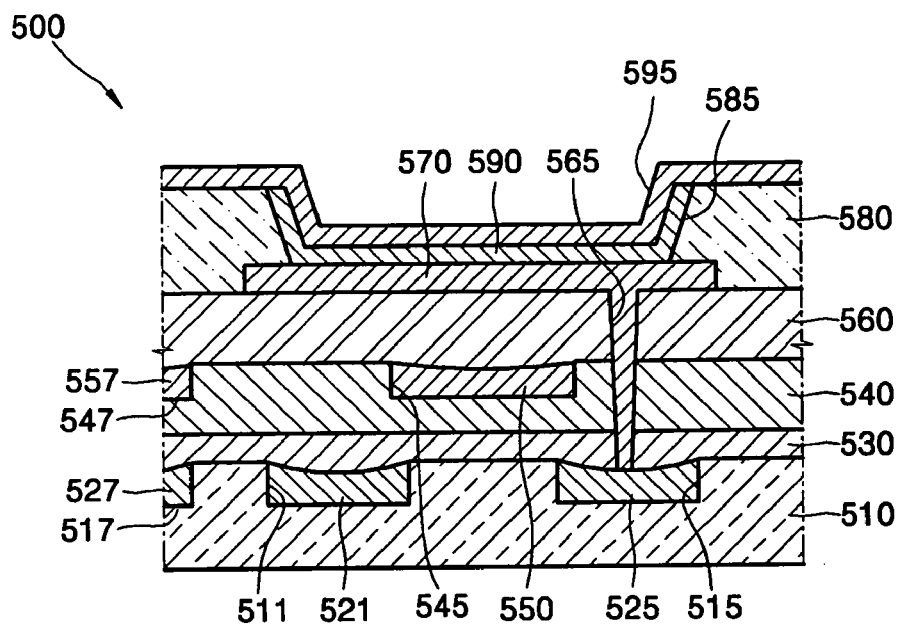
FIG. 9 is a cross-sectional view of a flexible organic electroluminescent display device having an organic thin film transistor manufactured by using a manufacturing method of an embodiment of the present invention.

Turning now to FIG. 9, FIG. 9 is a cross-sectional view of a flexible organic electroluminescent display device having the organic thin film transistor manufactured by using the manufacturing method of the embodiments of the present invention. In FIG. 9, only an organic electroluminescent element, a driving thin film transistor, and a capacitor in a pixel of the organic electroluminescent display device are shown.

Referring now to FIG. 9, the flexible organic electroluminescent display device 500 of an embodiment of the present invention includes a substrate 510 having grooves 511, 515, and 517. The substrate 510 is a plastic substrate. Source and drain electrodes 521 and 525 of a thin film transistor are formed in the grooves 511 and 515 of the substrate 510 and a lower electrode 527 of the capacitor is formed in the groove 517.

An organic semiconductor layer 530 is formed on the substrate 510 and on the source and drain electrodes 521 and 525 and a gate insulating layer 540 having the grooves 545 and 547 is formed on the semiconductor layer 530. The gate insulating layer 540 includes an organic insulating layer such as benzocyclobutene (BCB), polyimide, parylene or polyvinylphenol (PVP).

A gate electrode 550 of the thin film transistor is formed in the groove 545 of the gate insulating layer 540 and an upper electrode 557 of the capacitor is formed in the groove 547. A passivation layer 560 is formed on the gate electrode 550, the upper electrode 557, and the gate insulating layer 540. The passivation layer 560 has a via hole 565 for exposing one of the source and drain electrodes 521 and 525, for example. In FIG. 9, it is the drain electrode 525 and not the source electrode 521 that is shown as being exposed by via hole 565.

The passivation layer 560 includes an organic insulating layer made of one of benzocyclobutene (BCB), acryl organic compound, fluoropolyarrylether (FPAE), cytop, and perfluorocyclobutane (PFCB). The passivation layer 560 can include an inorganic insulating layer such as a nitride layer, an oxide layer, and an oxynitride layer.

A lower electrode 570 connected to the drain electrode 525 of the thin film transistor through the via hole 565 is formed on the passivation layer 560. The lower electrode 570 is an anode and serves as a pixel electrode. A pixel separation layer 580 having an opening 585 for exposing a part of the lower electrode is formed on the substrate.

An organic thin layer 590 is formed on the lower electrode 570 in the opening 585. The organic thin layer 590 includes at least one organic layer of either a hole injecting layer, a hole transport layer, an organic light-emitting layer, an electron transport layer, an electron injecting layer or a hole blocking layer. A cathode 595 is formed as an upper electrode on the substrate.

Figure 10:
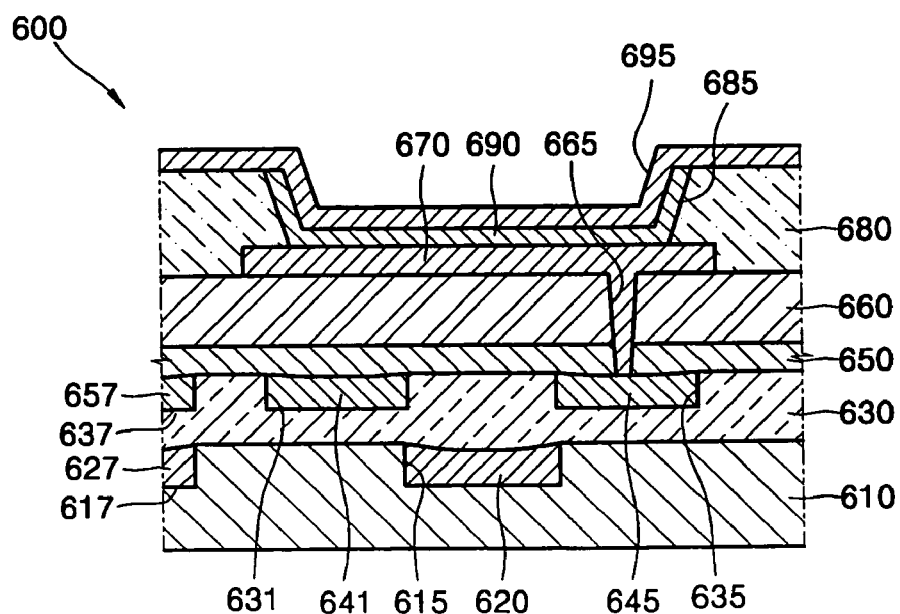
FIG. 10 is a cross-sectional view of a flexible organic electroluminescent display device having an organic thin film transistor manufactured by using a manufacturing method of another embodiment of the present invention.

Turning now to FIG. 10, FIG. 10 is a cross-sectional view of a flexible organic electroluminescent display device having an organic thin film transistor manufactured by using a manufacturing method of another embodiment of the present invention. In FIG. 10, only an organic electroluminescent element, a driving thin film transistor, and a capacitor in a pixel of the organic electroluminescent display device are shown.

Referring now to FIG. 10, a flexible organic electroluminescent display device 600 of another embodiment of the present invention includes a substrate 610 having grooves 615 and 617. The substrate 610 is a plastic substrate. A gate electrode 620 of the thin film transistor is formed in the groove 615 of the substrate 610 and a lower electrode 627 of the capacitor is formed in the groove 617.

A gate insulating layer 630 is formed on the substrate 610 and on the gate electrode 620. The gate insulating layer 630 has grooves 631 and 635 in which source and drain electrodes will be formed and a groove 637 in where a capacitor electrode will be formed. Source and drain electrodes 641 and 645 are formed in the grooves 631 and 635 of the gate insulating layer 630, respectively, and an upper electrode 657 of the capacitor is formed in the groove 637.

An organic semiconductor layer 650 is formed on the source and drain electrodes 641 and 645 and on the gate insulating layer 630. A passivation layer 660 is then formed on the organic semiconductor layer 650. The passivation layer 660 has a via hole 665 for exposing one of the source and drain electrodes 641 and 645. In FIG. 10, it is the drain electrode 645 and not the source electrode 641 that is shown to be exposed by via hole 665

The passivation layer 660 includes an organic insulating layer made of benzocyclobutene (BCB), acryl organic compound, fluoropolyarrylether (FPAE), cytop or perfluorocyclobutane (PFCB). The passivation layer 660 can include an inorganic insulating layer such as a nitride layer, an oxide layer, and an oxynitride layer.

A lower electrode 670 connected to the drain electrode 645 of the thin film transistor through the via hole 665 is formed in the passivation layer 660. The lower electrode 670 is an anode and serves as a pixel electrode. A pixel separation layer 680 having an opening 685 for exposing a part of the lower electrode 670 is formed on the substrate.

An organic thin layer 690 is formed on the lower electrode 670 in the opening 685. The organic thin layer 690 includes at least one organic layer of a hole injecting layer, a hole transport layer, at least one organic light-emitting layer, an electron transport layer, an electron injecting layer, and an hole blocking layer. A cathode 695 is formed as an upper electrode on the substrate.

The organic electroluminescent display device of the present invention can be applied to a display device having a thin film transistor in which a gate electrode or source and drain electrodes are formed by forming an insulating layer such as a buffer layer on a substrate and forming grooves in the insulating layer.

In the embodiments of the present invention, it has been exemplified that the insulating layer, the gate insulating layer, the passivation layer have a single-layered structure, but the present invention is not limited to the single-layered structure as a multi-layered structure can instead be employed for these layers. The layers can include an organic insulating layer or an inorganic insulating layer or a hybrid stacked layer of the organic insulating layer and the inorganic insulating layer. In addition, the semiconductor layer can include an inorganic semiconductor material in addition to the organic semiconductor material and the inorganic semiconductor material can be CdS, GaS, ZnS, CdSe, CaSe, ZnSe, CdTe, SiC, or Si.

In the embodiments of the present invention, it has been exemplified that the conductive pattern for the gate electrode and the source and drain electrodes of a thin film transistor are formed by irradiating a laser beam directly into the substrate via the laser ablation method to form the grooves. However, after forming an insulating layer such as a buffer layer on a substrate and then forming grooves in the insulating layer by irradiating a laser beam into the insulating layer via the laser ablation method, the gate electrode and the source and drain electrodes can be formed.

In the embodiments of the present invention, it has been exemplified that the conductive patterns are formed in the insulating layer or the substrate via the laser ablation method and the inkjet method. However, the present invention is not limited to it, but various patterns can be formed by using solvent etch techniques and the inkjet method without any photolithography process.

In the flexible organic electroluminescent display device having a plastic substrate as a substrate of the present invention, the conductive pattern and the organic thin film transistor have been formed via the laser ablation method and the inkjet method. The present invention is not limited to only these methods, but can be applied to the case where the conductive pattern or the organic thin film transistor is formed on a substrate such as a metal plate or a glass plate.

Although the organic electroluminescent display device having the organic thin film transistor as a switching element has been described in the embodiments of the present invention, the present invention is not limited thereto, but can be applied to a flat panel display device such as a liquid crystal display device using the organic thin film transistor as a switching element.

Of the embodiments of the present invention, the following advantages can be obtained. First, since the conductive pattern for the organic electroluminescent display device is formed via the laser ablation method or the etching method using a solvent and thus a photolithography process is not needed, it is possible to simplify the processes, to reduce manufacturing cost, and to facilitate the low-temperature process.

In addition, since the grooves are formed in the substrate or the insulating layer via the laser ablation method and the conductive pattern is then formed via the inkjet method, a particular bank forming process can be omitted. Accordingly, it is possible to simplify the processes and to prevent the generation of protrusions at the edges of the conductive pattern, thus preventing the generation of defects. That is, since the gate electrode or the source and drain electrodes are buried in the grooves, the substrate can maintain its flat surface. Therefore, a planarization layer or a passivation layer can be formed uniform in the subsequent processes. Since the gate or the source and drain electrodes are not protruded, it is possible to prevent the generation of defects or damage due to application of stress thereto.

Furthermore, since the gate or the source and drain electrodes are formed via the inkjet printing method, not via a method including a wet etching process, it is possible to prevent damage of organic substances formed before forming the electrodes.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A method, comprising:
    providing a base member, the base member being a homogeneous material;
    forming a groove in the base member; and
    forming a conductive pattern by applying, into the groove, a solution that includes conductive particles, the conductive particles being selected from a group consisting of Ag nanoparticles, Cu nanoparticles, Au nanoparticles, Pt nanoparticles and carbon nanoparticles, wherein a shape of the conductive pattern being determined by a shape of the groove.

2. The method of claim 1, wherein the homogenous material is a plastic material.

3. The method of claim 1, wherein the forming the groove in the base member includes irradiating a laser beam onto a portion of the base member where the conductive pattern is to be formed and etching the portion via a laser ablation process.

4. The method of claim 1, wherein the forming the groove in the base member comprises:
processing a surface of the base member in which the groove is to be formed;
pouring a solvent onto the surface of the base member; and
etching the surface of the base member.

5. The method of claim 1, wherein the applying, into the groove, the solution comprises ejecting and applying the solution comprising the conductive particles via an inkjet process.

6. The method of claim 1, wherein the forming the conductive pattern further includes curing the solution that includes the conductive particles via exposure to at least one of heat and ultraviolet radiation, the solution further comprising an organic binder.

7. The method of claim 4, the processing a surface of the base member in which the groove is to be formed comprises a process selected from a group consisting of a carbon tetrafluoride ($CF_4$) plasma process and a hexamethyldisiloxane (HMDSO) plasma process.

8. The method of claim 2, wherein the plastic material is selected from a group consisting of polyether sulphone (PES), polyacrylate (PAR), polyether imide (PEI), polyethylene napthalate (PEN), polyethylene terepthalate (PET), polyphenylene sulfide (PPS), polyarylate, polyimide, polycarbonate (PC), cellulose triacetate (TAC), and cellulose acetate propinonate (CAP).

9. The method of claim 1, wherein a nanoparticle is a particle with at least one dimension less than 100 nm.

* * * * *